(12) United States Patent
Park et al.

(10) Patent No.: US 9,236,339 B2
(45) Date of Patent: Jan. 12, 2016

(54) PLUG VIA STACKED STRUCTURE, STACKED SUBSTRATE HAVING VIA STACKED STRUCTURE AND MANUFACTURING METHOD THEREOF

(71) Applicant: SAMSUNG ELECTRO-MECHANICS CO., LTD., Gyeonggi-do (KR)

(72) Inventors: Seung Wook Park, Gyeonggi-do (KR); Christian Romero, Gyeonggi-do (KR); Chang Bae Lee, Gyeonggi-do (KR); Mi Jin Park, Gyeonggi-do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 329 days.

(21) Appl. No.: 13/906,951

(22) Filed: May 31, 2013

(65) Prior Publication Data
US 2013/0320561 A1    Dec. 5, 2013

(30) Foreign Application Priority Data

May 31, 2012 (KR) .......... 10-2012-0058293
Mar. 26, 2013 (KR) .......... 10-2013-0032210

(51) Int. Cl.
| | |
|---|---|
| H01L 23/498 | (2006.01) |
| H01L 21/768 | (2006.01) |
| H01L 21/48 | (2006.01) |
| H05K 3/42 | (2006.01) |
| H05K 1/11 | (2006.01) |

(52) U.S. Cl.
CPC ........ *H01L 23/49827* (2013.01); *H01L 21/486* (2013.01); *H01L 21/76877* (2013.01); *H05K 1/115* (2013.01); *H05K 3/42* (2013.01); *H01L 2924/0002* (2013.01); *H05K 1/112* (2013.01); *H05K 1/113* (2013.01); *H05K 2201/0959* (2013.01); *H05K 2201/09481* (2013.01)

(58) Field of Classification Search
CPC ............ H01L 23/49827; H01L 21/486; H01L 21/76877; H05K 1/112; H05K 1/113; H05K 1/115
See application file for complete search history.

(56) References Cited

U.S. PATENT DOCUMENTS 5,796,163 A    8/1998    Glenn et al.

FOREIGN PATENT DOCUMENTS

| JP | 2003-218530 A | 7/2003 |
| KR | 2010-0023641 A | 3/2010 |
| KR | 10-2011-0046126 A | 5/2011 |

OTHER PUBLICATIONS

Korean Office Action issued in Korean Application No. 10-2013-0032210 dated Apr. 16, 2014.

*Primary Examiner* — Colleen Matthews
*Assistant Examiner* — William Harriston
(74) *Attorney, Agent, or Firm* — McDermott Will & Emery LLP

(57) ABSTRACT

Disclosed herein is a plug via stacked structure including: a through hole plating layer plated on a through hole inner wall and around top and bottom of a through hole at thickness t; a via plug filled in an inner space of the through hole plating layer; a circuit pattern formed over the top and bottom of the through hole plating layer and the via plug and making a thickness t' formed on the through hole plating layer thicker than a thickness t; and a stacked conductive via filled in a via hole formed on the top of the through hole and formed at thickness $\alpha$ from a top of the circuit pattern, wherein $T \leq t'' + \alpha$ is satisfied, T represents a sum of the thicknesses t and t' and t'' is a thickness of a portion of the circuit pattern formed on the via plug.

20 Claims, 5 Drawing Sheets

US 9,236,339 B2

PLUG VIA STACKED STRUCTURE, STACKED SUBSTRATE HAVING VIA STACKED STRUCTURE AND MANUFACTURING METHOD THEREOF

CROSS REFERENCE(S) TO RELATED APPLICATIONS

This application claims the benefit under 35 U.S.C. Section 119 of Korean Patent Application Nos. 10-2012-0058293 and 10-2013-0032210, entitled "Plug Via Stacked Structure, Stacked Substrate Having Via Stacked Structure and Menufacturing Method Thereof" filed on May 31, 2012 and Mar. 26, 2013, which is hereby incorporated by reference in its entirety into this application.

BACKGROUND OF THE INVENTION

1. Technical Field

The present invention relates to a plug via stacked structure, a stacked substrate having a via stacked structure, and a manufacturing method thereof. More particularly, the present invention relates to a plug via stacked structure using a conductive via stacked on a top of a plug via of a substrate so as to secure a thickness of a circuit pattern on the top of the plug via of the substrate, a stacked substrate having a via stacked structure, and a manufacturing method thereof.

2. Description of the Related Art

According to the plug via according to the related art, when a thickness of a conductive metal, for example, Cu of a circuit pattern plated on a top of a plug via for power transmission is not secured, there is a problem of power transmission of a substrate. Therefore, the plug via having Cu plated thereinto at a sufficient thickness has been used.

According to the related art, when using the plug via, a method for permitting an increase in a plating thickness of a circuit has been easily applied so as to secure a plating thickness using a low end substrate rather than using a fine pattern substrate. That is, according to the related art, the plating thickness of 20 μm or more has been easily applied since patterns are not tight and therefore, the plating thickness can be controlled.

However, with the miniaturization of electronic devices, a demand for a fine pattern substrate has been increased. In the case of the plug via, the sufficient Cu for power transmission needs to be plated thereinto but in the case of the fine pattern substrate, a size and a plating thickness of a via hole are limited.

In other words, when fine patterns are applied to a substrate process, it is very important to secure the plating thickness used for power transmission at the time of using the plug via. In this case, the plating thickness on the top of the plug via is generally smaller than that therearound and thus, any problem may occur at the corresponding portion at the time of power transmission.

That is, when the thickness of the circuit pattern on the top of the via plug filled between plating layers in a substrate through hole in the plug via is not secured to some degree, a bottle neck phenomenon may occur at the time of current transmission.

RELATED ART DOCUMENT

Patent Document (Patent Document 1) U.S. Pat. No. 5,796,163 (published on Aug. 18, 1998)

SUMMARY OF THE INVENTION

An object of the present invention is to provide a technology of securing a necessary plating thickness on a plug via using a via connection plating thickness by perforating a via on a top of a plug via. Another object of the present invention is to provide a via stacked structure capable of securing an effective Imax value by securing a necessary plating thickness on a plug via using a via connection plating thickness.

According to an exemplary embodiment of the present invention, there is provided A plug via stacked structure, including: a through hole plating layer that is plated on an inner wall of a through hole formed on a substrate at a predetermined thickness and around top and bottom of the through hole at thickness t; a via plug that is filled in an inner space of the through hole plating layer and exposed by making top and bottom thereof penetrate through the top and bottom of the through hole plating layer; a circuit pattern that is formed over the top and bottom of the through hole plating layer and the via plug and makes a thickness t' formed on the through hole plating layer thicker than a thickness t; and a stacked conductive via that is filled in a via hole penetrating through a first insulating layer formed on the substrate and the circuit pattern and formed on the top of the through hole and is formed at thickness $\alpha$ from a top of the circuit pattern, wherein Equation T≤t"+$\alpha$ is satisfied, T represents a sum of the thickness t of the through hole plating layer and the thickness t' of the circuit pattern and t" is a thickness of a portion of the circuit pattern formed on the via plug.

$t'=t''$.

$t''=t'-\Delta t$, and $\Delta t$ may be a height of the via plug protruded from a top surface of the through hole plating layer.

When a diameter of the conductive via is D', a diameter of the via plug is d, and the smaller or same diameter of a diameter of the through hole plating layer of the top and bottom of the through hole and a diameter of the circuit pattern is D, D>D'>d.

When a diameter of the through hole of the substrate is Dvia, D'>Dvia.

The plug via stacked structure may further include: a second insulating layer formed on the first insulating layer.

The via plug may be formed of an epoxy material or a conductive material.

According to another exemplary embodiment of the present invention, there is provided a stacked substrate having a via stacked structure, including: a substrate on which a through hole is formed, a through hole plating layer plated on an inner wall of a through hole at a predetermined thickness and around top and bottom of the through hole at thickness t is formed, and a via plug filled in an inner space of the through hole plating layer and exposed by make top and bottom thereof penetrate through the top and bottom of the through hole plating layer is formed; a circuit pattern that is formed over the top and bottom of the through hole plating layer and the via plug and makes a thickness t' formed on the through hole plating layer thicker than a thickness t; and a first insulating layer formed on the substrate and the circuit pattern, and formed with a stacked conductive via that is filled in a via hole formed on the substrate and the circuit pattern and formed by penetrating through the top of the through hole to have a thickness $\alpha$ from a top of the circuit pattern, wherein Equation T≤t"+$\alpha$ is satisfied, T represents a sum of the thickness t of the through hole plating layer and the thickness t' of the circuit pattern and t" is a thickness of a portion of the circuit pattern formed on the via plug.

t'=t".

t"=t'−Δt, and Δt may be a height of the via plug protruded from a top surface of the through hole plating layer.

The stacked substrate may further include: a second insulating layer formed on the first insulating layer.

When a diameter of the conductive via is D', a diameter of the via plug is d, and the smaller or same diameter of a diameter of the through hole plating layer of the top and bottom of the through hole and a diameter of the circuit pattern is D, D>D'>d.

When a diameter of the through hole of the substrate is Dvia, D'>Dvia.

The via plug may be formed of an epoxy material or a conductive material.

According to still another exemplary embodiment of the present invention, there is provided a method for manufacturing having a via stacked structure, including: forming a through hole plating layer on an inner wall of a through hole formed on a substrate at a predetermined thickness and around top and bottom of the through hole at thickness t and forming a via plug filled in an inner space of the through hole plating layer and exposed by penetrating through the top and bottom of the through hole plating layer; forming a circuit pattern formed over the top and bottom of the through hole plating layer and forming the circuit pattern by making a thickness t' formed on the through hole plating layer thicker than a thickness t; and forming a stacked conductive via having a thickness α from the top of the circuit pattern by forming a first insulating layer formed on the substrate and the circuit pattern, forming a via hole penetrating through the first insulating layer on the top of the through hole, and filling the inside thereof, wherein in the forming of the stacked conductive via, Equation T≤t"+α is satisfied, T represents a sum of the thickness t of the through hole plating layer and the thickness t' of the circuit pattern and t" is the thickness of the portion of the circuit pattern formed on the via plug.

In the forming of the via plug, the exposed surface may be flush with the surface of the through hole plating layer therearound, and t'=t".

In the forming of the via plug, the exposed surface, the via plug may be further protruded than the surface of the through hole plating layer therearound, t"=t'−Δt, and Δt may be a height of the via plug protruded from a top surface of the through hole plating layer.

The method for manufacturing having a via stacked structure may further include: after the forming of the stacked conductive via, forming a second insulating layer on the first insulating layer.

When a diameter of the conductive via is D', a diameter of the via plug is d, and the smaller or same diameter of a diameter of the through hole plating layer of the top and bottom of the through hole and a diameter of the circuit pattern is D, D>D'>d.

In the forming of the via plug, the via plug may be formed by filling the inner space of the through hole plating layer with an epoxy material or a conductive paste material.

DESCRIPTION OF THE PREFERRED EMBODIMENTS

Figure 1:
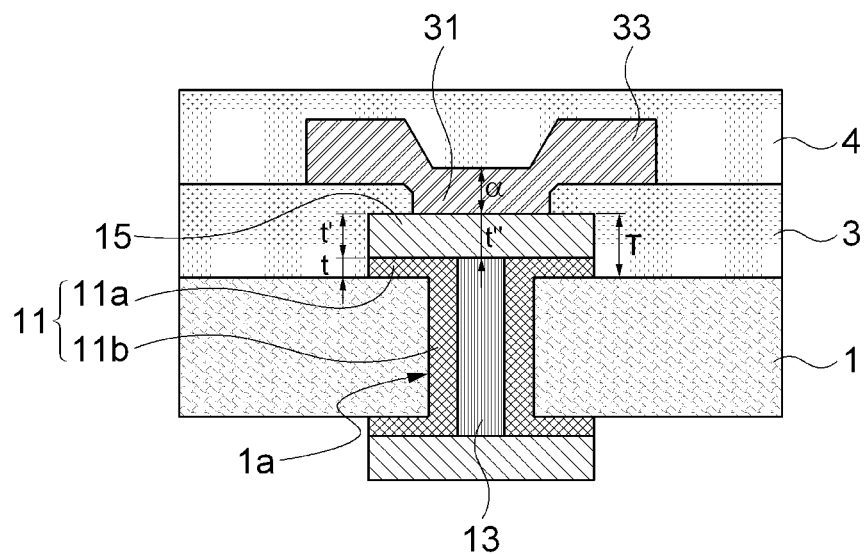
FIG. 1 is a cut cross-sectional view schematically showing a plug via stacked structure and a stacked substrate having a via stacked structure according to an exemplary embodiment of the present invention.

Exemplary embodiments of the present invention for accomplishing the above-mentioned objects will be described with reference to the accompanying drawings. In describing exemplary embodiments of the present invention, the same reference numerals will be used to describe the same components and an additional description that is overlapped or allow the meaning of the present invention to be restrictively interpreted will be omitted.

In the specification, it will be understood that unless a term such as 'directly' is not used in a connection, coupling, or disposition relationship between one component and another component, one component may be 'directly connected to', 'directly coupled to' or 'directly disposed to' another element or be connected to, coupled to, or disposed to another element, having the other element intervening therebetween.

Although a singular form is used in the present description, it may include a plural form as long as it is opposite to the concept of the present invention and is not contradictory in view of interpretation or is used as clearly different meaning. It should be understood that "include", "have", "comprise", "be configured to include", and the like, used in the present description do not exclude presence or addition of one or more other characteristic, component, or a combination thereof.

The accompanying drawings referred in the present description may be examples for describing exemplary embodiments of the present invention. In the accompanying drawings, a shape, a size, a thickness, and the like, may be exaggerated in order to effectively describe technical characteristics First, a plug via stacked structure according to a first exemplary embodiment of the present invention will be described in detail with reference to the accompanying drawings. In this case, reference numerals that are not shown in the accompanying drawings may be reference numerals in other drawings showing the same configuration.

Figure 2:
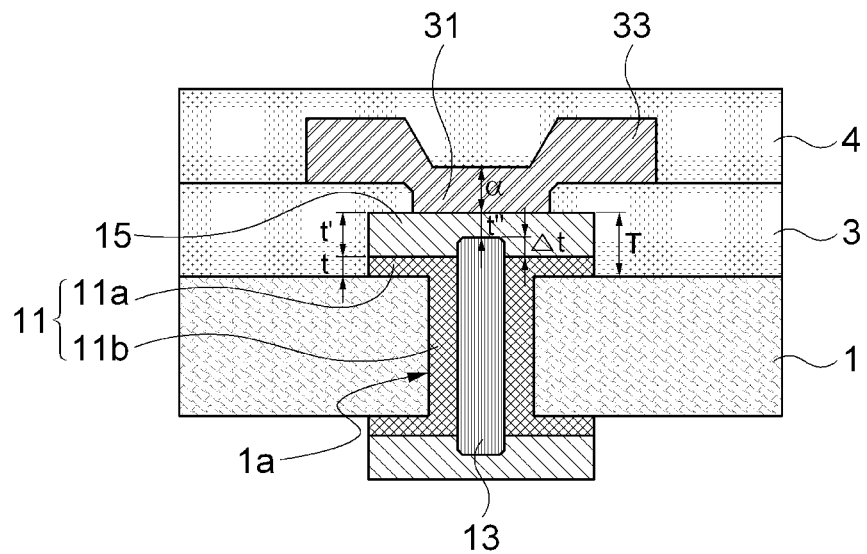
FIG. 2 is a cut cross-sectional view schematically showing a plug via stacked structure and a stacked substrate having a via stacked structure according to another exemplary embodiment of the present invention.
Figure 3:
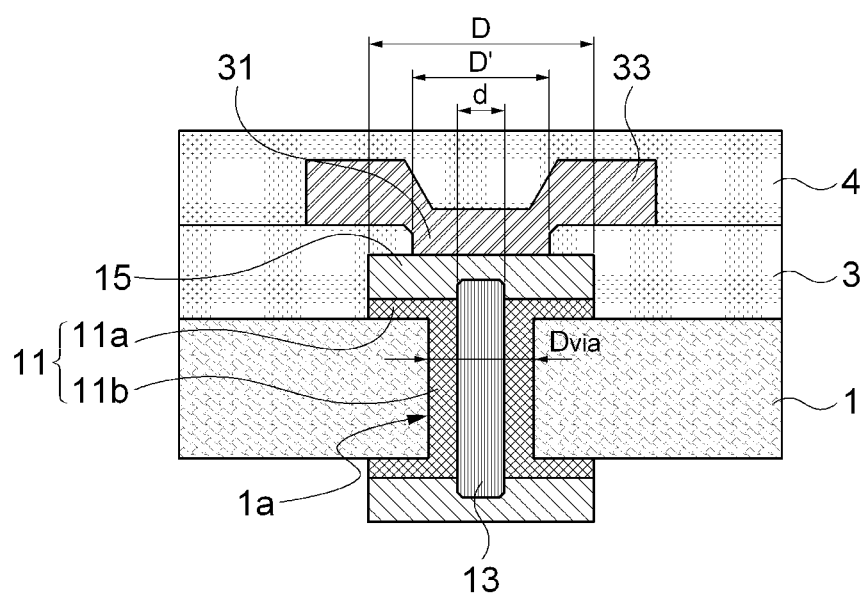
FIG. 3 is a cross-sectional view schematically showing a plug via stacked structure and a stacked substrate having a via stacked structure according to another exemplary embodiment of the present invention.

FIG. 1 is a cut cross-sectional view schematically showing a plug via stacked structure according to an exemplary embodiment of the present invention, FIG. 2 is a cut cross-sectional view schematically showing a plug via stacked structure according to another exemplary embodiment of the present invention, and FIG. 3 is a cross-sectional view schematically showing a plug via stacked structure according to another exemplary embodiment of the present invention.

Referring to FIGS. 1 to 3, a plug via stacked structure according to an exemplary embodiment of the present invention is configured to include a through hole plating layer 11, a via plug 13, a circuit pattern 15, and a stacked conductive via 31.

For detailed description of the present invention in FIGS. 1 to 3 2, a stacked conductive via 31 and insulating layers 3 and 4 are stacked only on a top of a substrate 1. However, similar to the case stacked on the top of the substrate, it is to be noted that the insulating layers and the stacked conductive via 31 may be formed on the bottom of the substrate 1. In addition, in FIGS. 1 to 3, a first insulating layer 3 and a second insulating layer 4 are each shown as the insulating layer. However, a cover material may be stacked instead of the second insulating layer 4 or one or more insulating layer may be additionally stacked in addition to the first and second insulating layers 3 and 4.

In this case, the through hole plating layer 11 is formed in an inner wall of a through hole 1a formed on the substrate 1 at a predetermined thickness and is formed around the top and bottom of the through hole 1a at thickness t. In this case, the substrate 1 may be a core substrate. In this case, a material of the core substrate 1 may be formed of a known material used for the stacked substrate. In FIGS. 1 to 3, reference numeral 11a represents the through hole plating layer formed around the top and bottom of the through hole 1a and reference numeral 11b represents the through hole plating layer 11 formed in the inner wall of the thorough hole 1a. The through hole plating layer 11 may be formed by plating the through hole 1a of the substrate 1. The through hole plating layer 11 may be plated with a conductive metal, for example, Cu. For example, the through hole plating layer 11 may be formed of Copper-Clad Invar™ (CCI) material.

In addition, the via plug 13 is formed by being filled in the inner space of the through hole plating layer 11. The top and bottom of the via plug 13 penetrate through the top and bottom of the through hole plating layer 11 and thus, the via plug 13 is exposed. In this case, as shown in FIG. 1, an exposed top surface of the via plug 13 flush with a top surface of the through hole plating layer 11 or as shown in FIG. 2, the top surface of the via plug 13 may be further protruded than a top surface of the through hole plating layer 11. For example, referring to FIG. 2, in one exemplary embodiment, the via plug 13 is protruded by Δt from the top surface of the through hole plating layer 11. In the present specification, the top and bottom exposure or the exposed surface of the via plug 13 means a state of being relatively exposed to the outside of the through hole plating layer 11 and, for example, is not exposed to the outside of the circuit pattern 15 covering the via plug 13.

For example, the via plug 13 may be formed by filling the inner space of the through hole plating layer 11 with an insulating material. For example, the via plug 13 may be filled with an epoxy material. When the via plug 13 is formed of an insulating material, a power transmission problem may be serious due to a wiring thickness of a top section of the via plug 13. In the present embodiment, the wiring thickness of the top section of the via plug 13 is formed not to be smaller than that of surrounding wirings, that is, wirings around the through hole 1a, thereby solving the power transmission problem due to the wiring thickness of the top section of the via plug 13. Alternatively, in another example, the inner space of the through hole plating layer 11 is filled with, for example, a conductive paste to form the via plug 13.

Next, reviewing the circuit pattern 15 with reference to FIGS. 1 to 3, the circuit pattern 15 is formed over the top and bottom the through hole plating layer 11 and the via plug 13. In this case, referring to FIGS. 1 and 2, the thickness of the circuit pattern 15, in more detail, the thickness of a portion of the circuit pattern 15 formed on the top and bottom of the through hole plating layer 11 may be formed to be thicker than the thickness t of the through hole plating layer 11. That is, the thickness of the circuit pattern 15, in more detail, the thickness t' of the portion of the circuit pattern 15 formed on the top and bottom of the through hole plating layer 11 is thicker than the thickness t of the through hole plating layer 11 plated around the top and bottom of the through hole 1a. For example, the top surface of the via plug 13 may be protruded than the top surface of the through hole plating layer 11, such that it is preferable that the thickness of the circuit pattern 15 formed over the top and bottom of the through hole plating layer 11 and the via plug 13, that is, the thickness t' of the portion of the circuit pattern 15 formed on the top and bottom of the through hole plating layer 11 is formed to be thicker than the thickness t of the through hole plating layer 11 plated around the top and bottom of the through hole 1a. In this case, the circuit pattern 15 may be plated with a conductive metal, for example, a Cu material. The circuit pattern 15 may be formed by a method for forming patterns according to the related art.

To be continued, the stacked conductive via 31 will be described with reference to FIGS. 1 to 3. The first insulting layer 3 is formed on the substrate 1 and the circuit pattern 15. The first insulating layer 3 may be formed of the known insulating material used for the stacked substrate. In this case, the top of the through hole 1a is formed with a via hole penetrating through the first insulating layer 3 and the stacked conductive via 31 is formed by filling the via hole on the first insulating layer 3 with the conductive material. The stacked conductive via 31 is stacked on the top of the through hole 1a of the substrate 1. In addition, the stacked conductive via 31 is formed to have a thickness α from the top of the circuit pattern 15. The stacked conductive via 31 may be formed of the conductive material, for example, the same material or different materials as or from the circuit pattern 15.

For example, referring to FIGS. 1 to 3, the stacked conductive via 31 may be formed in the via hole on the first insulating layer 3 and the circuit pattern 33 may be formed around the via hole on the top of the first insulating layer 3. In this case, the second insulating layer 4 may be additionally provided on the top of the circuit pattern 33.

In this case, referring to FIGS. 1 and 2, if a sum of the thickness t of the through hole plating layer 11 and the thickness t' of the circuit pattern 15 is set to be T, the following Equation 1 needs to be satisfied.

$$T \leq t'' + \alpha \qquad \text{Equation 1}$$

In this case, t' is the thickness of the circuit pattern 15, in more detail, the thickness of the portion of the circuit pattern 15 formed on the top and bottom of the through hole plating layer 11, t'' is the thickness of the portion of the circuit pattern 15 formed on the via plug 13, and α is the thickness from the top of the circuit pattern to the top of the stacked conductive via 31.

By satisfying the above Equation 1, it is possible to prevent a bottle neck phenomenon from occurring due to the reduction in the wiring thickness in the top section of the through hole 1a, in detail, the top section of the via plug 13. That is, it is possible to prevent the power transmission problem in proportion to the increase in the wiring resistance due to the bottle neck phenomenon caused by the sudden reduction in the wiring thickness.

According to one example, as shown in FIG. 1, the top surface of the via plug 13 may be flush with the top surface of the through hole plating layer 11 and in this case, the thickness t'' of the above Equation (1) is equal to the thickness of the circuit pattern 15, in other words, the thickness t' of the portion of the circuit pattern formed on the top and bottom of the through hole plating layer 11. That is, t"=t'.

Alternatively, referring to FIG. 2, in another example, the top surface of the via plug 13 may be formed to be protruded by Δt than the top surface of the through hole plating layer 11 and in this case, the above Equation (1) becomes T≤t'−Δt+α. That is, t"=t'−Δt. t' is the thickness of the portion of the circuit pattern 15 formed on the top and bottom of the through hole plating layer 11 and Δt is a protruded height of the via plug from the top surface of the through hole plating layer 11. In this case, if T>t'−Δt+α on the top of the via plug 13 of, for example, an insulating material, the wiring thickness of the top section of the via plug 13 is more reduced than other sections to cause the bottle neck phenomenon, such that the power transmission problem may occur, which may be solved by satisfying T≤t'−Δt+α as in the exemplary embodiment of the present invention.

For example, T may be approximately 8 to 20 μm. In this case, t' may be approximately 5 to 17 μm. Also, t may be approximately 3 to 5 μm smaller than t'.

In this case, one example will be described with reference to FIG. 3. Referring to FIG. 3, in one example, when a diameter of the conductive via is D' and a diameter of the via plug 13 is d, D'>d. For this reason, when D' is smaller than d, the area in which the plating thickness of the circuit pattern 15 on the top of the via plug 13 is small cannot be sufficiently filled with the stacked conductive via 31 on the top of the via plug 13 and thus, the plating thickness is not secured, which may have an effect on the power transmission.

In one example, when the smaller or same diameter of the diameter of through hole plating layer 11 on the top and bottom of the through hole 1a and the diameter of the circuit pattern 15 is D, D>D'. For example, the via stacked structure, D>D'>d needs to be satisfied. FIG. 3 illustrates the case in which the top surface of the via plug 13 is further protruded than the top surface of the through hole plating layer 11, but the condition of D>D'>d may be applied to the case in which the top surface of the via plug 13 is the same as the top surface of the through hole plating layer 11 as shown in FIG. 1.

In addition, referring to FIG. 3, in one example, in the case of D'>d, when the diameter of the through hole 1a of the substrate 1 is Dvia, D'>Dvia. In another example, in the case of D'>d, D'≤Dvia.

In this case, when the smaller or same diameter of the diameter of through hole plating layer 11 on the top and bottom of the through hole 1a and the diameter of the circuit pattern 15 is D, D>D'. For example, in the via stacked structure, D>D'>Dvia.

For example, Dvia may be approximately 70 to 250 μm and D' may be approximately Dvia+50 μm. In addition, D may be a range between approximately Dvia+50 μm and Dvia+100 μm.

Another example will be described with reference to FIGS. 1 to 3. In FIGS. 1 to 3, the plug via stacked structure according to one example may further include the second insulating layer 4 formed on the first insulating layer 3. The second insulating layer 4 may be formed of the same material or a heterogeneous insulating material as or from the first insulating layer 3.

Next, a stacked substrate having via stacked structure according to a second exemplary embodiment of the present invention will be described in detail with reference to the accompanying drawings. In this case, the plug via stacked structure according to the first exemplary embodiment of the present invention may be referred to and therefore, the overlapping descriptions thereof may be omitted.

FIG. 1 is a cut cross-sectional view schematically showing a stacked substrate having a via stacked structure according to an exemplary embodiment of the present invention, FIG. 2 is a cut cross-sectional view schematically showing a stacked substrate having a via stacked structure according to another exemplary embodiment of the present invention, and FIG. 3 is a cross-sectional view schematically showing a stacked substrate having a via stacked structure according to another exemplary embodiment of the present invention.

Referring to FIGS. 1 to 3, the stacked substrate having the via stacked structure according to one example is configured to include the substrate 1, the circuit pattern 15, and the first insulating layer 3. Although not shown, in FIGS. 1 to 3, similar to the case stacked on the top of the substrate, the insulating layer and the stacked conductive via 31 may be formed on the bottom of the substrate 1.

In FIGS. 1 to 3, the substrate 1 is provided with the through hole 1a. In this case, the substrate 1 may be a core substrate. The inner wall of the through hole 1a of the substrate 1 is provided with the through hole plating layer 11 at a predetermined thickness and the through hole plating layer 11 is formed around the top and bottom of the through hole 1a at the thickness t. The inner wall of the through hole 1a and the through hole plating layer 11 formed therearound may be formed by a plating method. The through hole plating layer 11 may be plated with a conductive metal, for example, Cu.

In addition, the inner side enclosed by the inner wall of the through hole plating layer 11 of the substrate 1 is filled with the via plug 13. In this case, the via plug 13 is exposed to penetrate through the top and bottom of the through hole plating layer 11. For example, as shown in FIG. 1, the exposed top surface of the via plug 13 may be flush with the top surface of the through hole plating layer 11 or as shown in FIG. 2, the top surface of the via plug 13 may be formed to be further protruded than the top surface of the through hole plating layer 11.

In one example, the via plug 13 may be formed by filling the inner space of the through hole plating layer 11 with the insulating material, for example, the epoxy material. Alternatively, the via plug 13 may be formed by filling the inner space of the through hole plating layer 11 with a conductive paste material.

Next, reviewing the circuit pattern 15 of FIGS. 1 to 3, the circuit pattern 15 is formed over the top and bottom of the through hole plating layer 11 and on the via plug 13. In this case, referring to FIGS. 1 and 2, the thickness t' of the circuit pattern 15, in more detail, the thickness t' of the portion of the circuit pattern 15 formed on the top and bottom of the through hole plating layer is thicker than the thickness t of the top and bottom of the through hole plating layer 11. In this case, the circuit pattern 15 may be plated with a conductive metal, for example, a Cu material by the known plating method.

To be continued, referring to FIGS. 1 to 3, the first insulating layer 3 is formed on the substrate 1 and the circuit pattern 15. The first insulating layer 3 is provided with a via hole formed on the top of the through hole 1a by penetrating through the first insulating layer 3. The first insulating layer 3 may be formed of the known insulating material used for the stacked substrate. In this case, the inside of the via hole formed by penetrating through the first insulating layer 3 is provided with the stacked conductive via 31 filled with the conductive material. The stacked conductive via 31 is stacked on the top of the through hole 1a by filling the conductive material in the via hole by the thickness α from the top of the circuit pattern. The stacked conductive via 31 may be formed of a conductive material, for example, the same material or different materials as or from the circuit pattern 15.

For example, referring to FIGS. 1 to 3, the stacked conductive via 31 may be formed in the via hole on the first insulating layer 3 and the circuit pattern 33 may be formed around the top via hole of the first insulating layer 3. In this case, the second insulating layer 4 may be additionally provided on the top of the circuit pattern 33.

In this case, if the sum of the thickness t of the through hole plating layer 11 and the thickness t' of the circuit pattern 15 is set to be T, the following Equation 1 needs to be satisfied.

$$T < t'' + \alpha \quad \text{Equation 1}$$

In this case, t' is the thickness of the circuit pattern 15, in more detail, the thickness of the portion of the circuit pattern 15 formed on the top and bottom of the through hole plating layer 11, t'' is the thickness of the portion of the circuit pattern 15 formed on the via plug 13, and α is the thickness from the top of the circuit pattern to the top of the stacked conductive via 31. Therefore, it is possible to prevent a bottle neck phenomenon from occurring due to the reduction in the wiring thickness in the top section of the through hole 1a, in detail, the top section of the via plug 13.

According to one example, as shown in FIG. 1, the top surface of the via plug 13 may be flush with the top surface of the through hole plating layer 11 and in this case, the thickness t'' of the above Equation (1) is equal to the thickness of the circuit pattern 15, in other words, the thickness t' of the portion of the circuit pattern formed on the top and bottom of the through hole plating layer 11. That is, t''=t'.

Alternatively, referring to FIG. 2, in another example, the top surface of the via plug 13 may be formed to be protruded by Δt than the top surface of the through hole plating layer 11 and in this case, the above Equation (1) becomes T≤t'−Δt+α. That is, t''=t'−Δt. t' is the thickness of the portion of the circuit pattern 15 formed on the top and bottom of the through hole plating layer 11 and Δt is a protruded height of the via plug from the top surface of the through hole plating layer 11.

In this case, one example will be described with reference to FIG. 3. Referring to FIG. 3, when the diameter of the conductive via is D' and the diameter of the via plug 13 is d, D'>d. When D' is smaller than d, the area in which the plating thickness of the circuit pattern 15 on the top of the via plug 13 is small cannot be sufficiently filled with the stacked conductive via 31 on the top of the via plug 13 and thus, the plating thickness is not secured, which may have an effect on the power transmission.

In this case, in another example, when the smaller or same diameter of the diameter of through hole plating layer 11 on the top and bottom of the through hole 1a and the diameter of the circuit pattern 15 is D, D>D'. For example, the via stacked structure, D>D'>d needs to be satisfied.

In addition, referring to FIG. 3, in one example, in the case of D'>d, when the diameter of the through hole 1a of the substrate 1 is Dvia, D'>Dvia. In this case, when the smaller or same diameter of the diameter of through hole plating layer on the top and bottom of the through hole 1a and the diameter of the circuit pattern 15 is D, D>D'. For example, the via stacked structure, D>D'>Dvia. Alternatively, in another example, when D'>d, D'≤Dvia.

Further, reviewing one example with reference to FIGS. 1 to 3, the stacked substrate having the via stacked structure according to one example may further include the second insulating layer 4 formed on the first insulating layer 3. The second insulating layer 4 may be formed of the same material or a heterogeneous material as or from the first insulating layer 3.

Next, a method for manufacturing a stacked substrate having via stacked structure according to a third exemplary embodiment of the present invention will be described in detail with reference to the accompanying drawings. In this case, as described above, the plug via stacked structures according to the first exemplary embodiment of the present invention and the stacked substrates having the via stacked structure according to the first exemplary embodiment of the present invention may be referred to FIGS. 1 to 3 and therefore, the overlapping descriptions thereof will be omitted.

Figure 4:
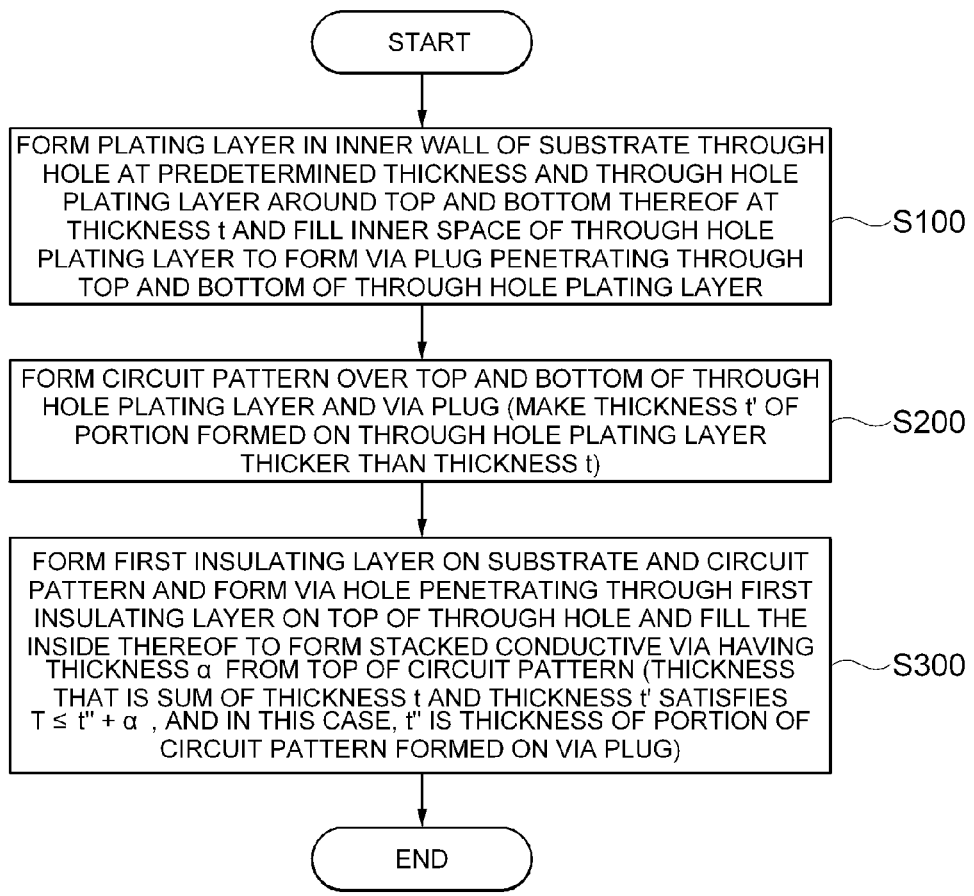
FIG. 4 is a flow chart schematically showing a method for manufacturing a stacked substrate having a via stacked structure according to another exemplary embodiment of the present invention.
Figure 5:
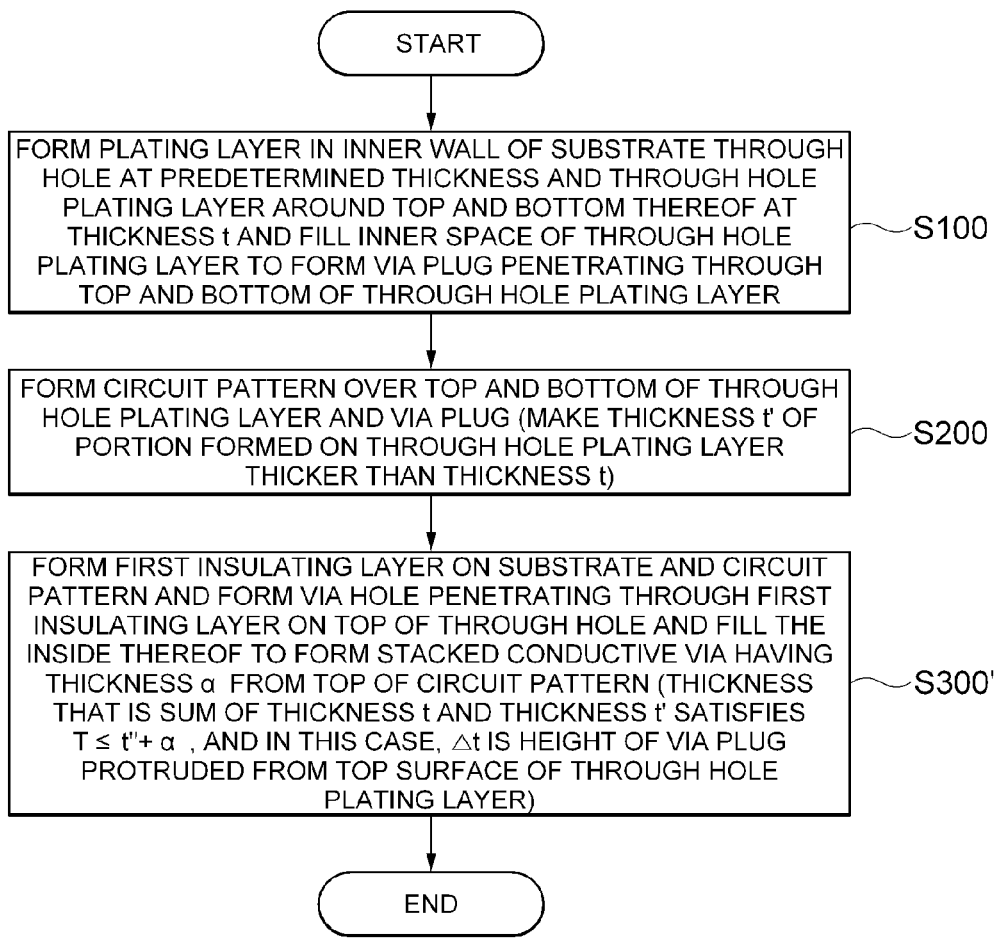
FIG. 5 is a flow chart schematically showing a method for manufacturing a stacked substrate having a via stacked structure according to another exemplary embodiment of the present invention.
Figure 6:
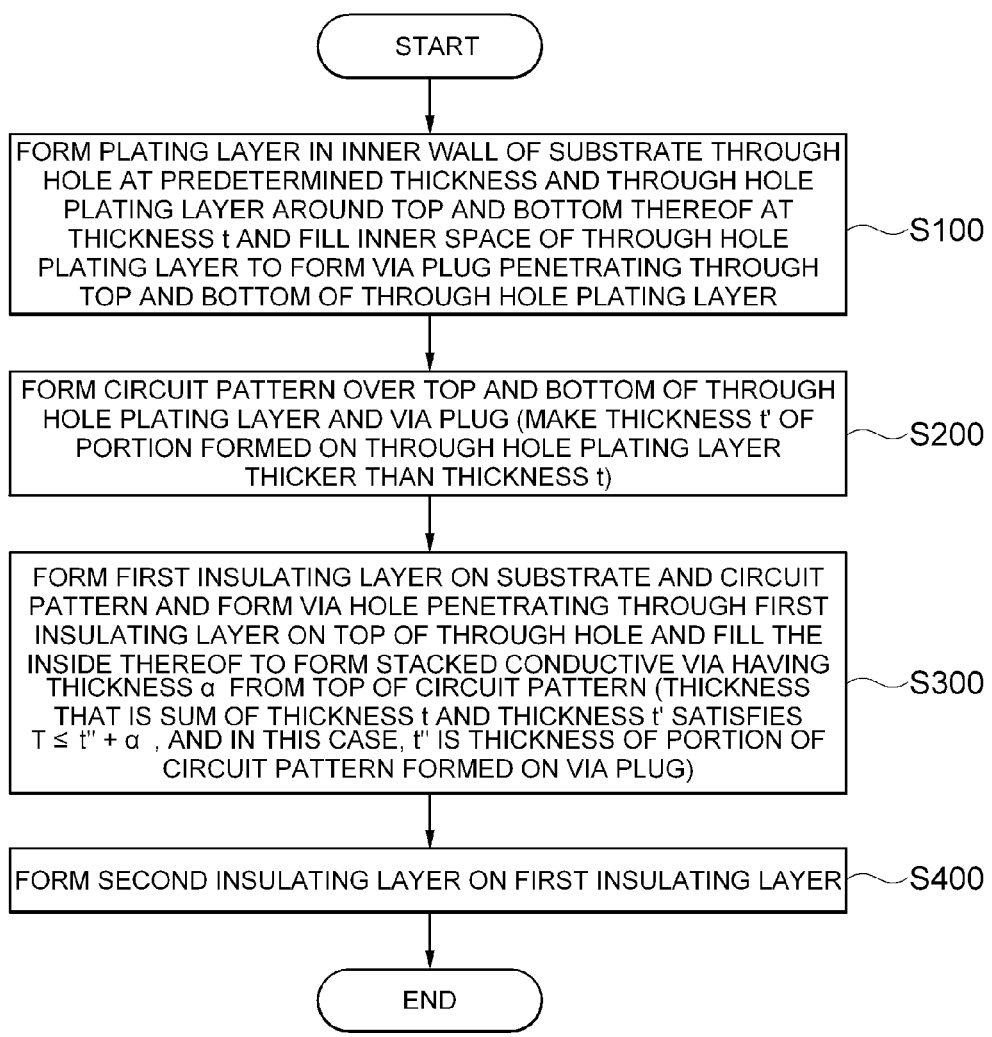
FIG. 6 is a flow chart schematically showing a method for manufacturing a stacked substrate having a via stacked structure according to still another exemplary embodiment of the present invention.

FIG. 4 is a flow chart schematically showing a method for manufacturing a stacked substrate having a via stacked structure according to another exemplary embodiment of the present invention, FIG. 5 is a flow chart schematically showing a method for manufacturing a stacked substrate having a via stacked structure according to another exemplary embodiment of the present invention, and FIG. 6 is a flow chart schematically showing a method for manufacturing a stacked substrate having a via stacked structure according to still another exemplary embodiment of the present invention.

Referring to FIGS. 4 to 6, the method for manufacturing a stacked substrate having a via stacked structure according to one example may be performed including forming a through hole plating layer and a via plug (S100), forming a circuit pattern (S200), and forming an insulating layer and a conductive via (S300 and S300'). Further, referring to FIG. 6, in one example, the method may further include forming a second insulating layer (S400).

Referring to FIGS. 4 to 6, in the forming of the through hole plating layer and the via plug (S100), the through hole plating layer 11 is formed in the inner wall of the through hole 1a formed on the substrate 1 at a predetermined thickness and is formed around the top and bottom of the through hole 1a at the thickness t. For example, the substrate 1 may be a core substrate and may be formed of a known material and the through hole plating layer 11 may be plated with a conductive metal, for example, a Cu material.

In addition, in the forming of the through hole plating layer and the via plug (S100), the via plug 13 is filled in the inner space of the through hole plating layer 11 and exposed by penetrating through the top and bottom of the through hole plating layer 11. For example, in the forming of the through hole plating layer and the via plug (S100), as shown in FIG. 1, the exposed top surface of the via plug 13 flush with a top surface of the through hole plating layer 11 or as shown in FIG. 2, the via plug 13 may be formed so that the top surface of the via plug 13 may be further protruded than the top surface of the through hole plating layer 11.

Further, according to one example, in the forming of the through hole plating layer and the via plug (S100), the via plug 13 may be formed by filling the inner space of the through hole plating layer 11, that is, the inner space of the plating layer plated on the inner wall of the through hole 1a with an insulating material, for example, an epoxy material. Alternatively, the via plug 13 may be formed by filling the inner space of the through hole plating layer 11 with a conductive paste material.

Next, referring to FIGS. 4 to 6, in the forming of the circuit patter (S200), the circuit pattern 15 is formed over the top and bottom of the through hole plating layer 11 and on the via plug 13. In this case, the circuit pattern 15 is formed to have the thickness t' thicker than the thickness t of the through hole plating layer 11 around the top and bottom of the through hole 1a. That is, the circuit pattern 15 is formed over the top and bottom of the through hole plating layer 11 and the via plug 13 so that the thickness of the circuit pattern 15, in more detail, the thickness t' of the portion of the circuit pattern 15 formed on the top and bottom of the through hole plating layer 11 is thicker than the thickness t of the through hole plating layer 11 around the top and bottom of the through hole 1a. In this case, the circuit pattern 15 may be formed of plating the conductive metal, for example, the Cu material by the known plating method.

To be continued, referring to FIGS. 4 to 6, in the forming of the insulating layer and the conductive via (S300 and S300'), the first insulating layer 3 is formed on the substrate 1 and the circuit pattern 15 and the stacked conductive via 31 is formed on the first insulating layer 3. In detail, in the forming of the first insulating layer (see S300 and S300' of FIGS. 4 to 6), the first insulating layer 3 is stacked on the substrate 1 and the circuit pattern 15. In this case, the first insulating layer 3 may be formed by stacking the known substrate material.

In addition, in the forming of the conductive via (see S300 AND S300' of FIGS. 4 to 6), the via hole penetrating through the first insulating layer 3 is formed on the through hole 1a and the stacked conductive via 31 S300 having the thickness α from the top of the circuit pattern by filling the inside of the via hole with, for example, a conductive material. In this case, the conductive via 31 may be formed by filling the same or heterogeneous material as or from the circuit pattern 15.

In this case, in the forming of the conductive via (see S300 of FIGS. 4 and 6), if the sum of the thickness t of the through hole plating layer 11 and the thickness t' of the circuit pattern 15 is set to be T, the following Equation 1 needs to be satisfied.

$$T \leq t'' + \alpha \qquad \text{Equation 1}$$

In this case, t' is the thickness of the circuit pattern 15, in more detail, the thickness of the portion of the circuit pattern 15 formed on the top and bottom of the through hole plating layer 11, t'' is the thickness of the portion of the circuit pattern 15 formed on the via plug 13, and a is the thickness from the top of the circuit pattern to the top of the stacked conductive via 31.

According to one example, in the forming of the through hole plating layer and the via plug (S100), as shown in FI. 1, the via plug 13 is formed so that the top surface of the via plug 13 is flush with the top surface of the through hole plating layer 11. That is, the via plug 13 is formed so that the exposed surface of the via plug 13 is flush with the surface of the through hole plating layer 11 around the exposed surface of the via plug 13. Therefore, in the forming of the circuit pattern (S200), the thickness t'' of the portion 15 formed on the via plug 13 of Equation 1 may be the same as the thickness t' of the portion of the circuit pattern 15 formed on the top and bottom of the through hole plating layer 11. That is, t''=t'.

Alternatively, according to another example, in the forming of the through hole plating layer and the via plug (S100), as shown in FIG. 2, the via plug 13 may be formed to be protruded by Δt than the surface of the through hole plating layer 11 therearound. In this case, the thickness t''=t'−Δt of the portion of the circuit pattern 15 formed on the via plug 13. t' is a thickness of the portion of the circuit pattern 15 formed on the top and bottom of the through hole plating layer 11. Δt is a height of the via plug 13 protruded from the top surface of the through hole plating layer 11. Therefore, referring to FIG. 5, in the forming of the conductive via (see S300' of FIG. 5), the conductive via 31 may be formed so that Equation 1 becomes T≤t'−Δt+α.

In this case, reviewing one example with reference to FIG. 3, when the diameter of the conductive via is D' and the diameter of the via plug 13 is d, in the forming of the conductive via (see S300 of FIGS. 4 and 6), the conductive via 31 is formed so that D'>d. When D' is smaller than d, the area in which the plating thickness of the circuit pattern 15 on the top of the via plug 13 is small cannot be sufficiently filled with the stacked conductive via 31 on the top of the via plug 13 and thus, the plating thickness is not secured, which may have an effect on the power transmission.

In this case, when the smaller or same diameter of the diameter of through hole plating layer 11 on the top and bottom of the through hole 1a and the diameter of the circuit pattern 15 is D, in the forming of the conductive via (see S300 of FIGS. 4 and 6), the conductive via 31 may be formed so that D>D'. For example, the via stacked structure, D>D'>d needs to be satisfied.

In addition, in one example, in the case of D'>d, when the diameter of the through hole 1a of the substrate 1 is Dvia, D'>Dvia. In this case, when the smaller or same diameter of the diameter of through hole plating layer 11 on the top and bottom of the through hole 1a and the diameter of the circuit pattern 15 is D, D>D'. For example, the via stacked structure, D>D'>Dvia. Alternatively, in another example, in case of D'>d, D'≤Dvia.

Further, referring to FIG. 6, in one example, the method for manufacturing a stacked substrate having a via stacked structure may further include forming a second insulating layer (S400) in addition to the forming of the through hole plating layer and the via plug (S100), the forming of the circuit pattern (S200), and the forming of the insulating layer and the conductive via (S300) of FIG. 4 as described above. Although not shown, after the forming of the insulating layer and the conductive via of FIG. 5 (S300'), the method may further include the forming of the second insulating layer (S400).

In the forming of the second insulating layer (S400), the second insulating layer 4 is formed on the first insulating layer 3. In this case, the second insulating layer 4 may be formed by stacking the same or different insulating material as or from the first insulating layer 3.

According to exemplary embodiments of the present invention, it is possible to secure the necessary plating thickness on the plug via using the via connection plating thickness by perforating the via on the top of the plug via.

Further, it is possible to secure the effective Imax value by securing the necessary plating thickness on the plug via by using the via connection plating thickness.

In addition, it is possible to easily secure the plating thickness for transmission of Imax to save the plating cost for securing the plating thickness.

Moreover, it is possible to improve unit per hour (UPH) and implement the fineness of the patterns due to the reduction in the plating thickness.

Also, the exemplary embodiments of the present invention can effectively control the weak point due to the thickness deviation occurring due to the plating on the top of the plug via, thereby very easily forming the fine pattern substrate.

It is obvious that various effects directly not stated according to various exemplary embodiment of the present invention may be derived by those skilled in the art from various configurations according to the exemplary embodiments of the present invention.

The accompanying drawings and the above-mentioned exemplary embodiments have been illustratively provided in order to assist in understanding of those skilled in the art to which the present invention pertains rather than limiting a scope of the present invention. In addition, exemplary embodiments according to a combination of the above-mentioned configurations may be obviously implemented by those skilled in the art. Therefore, various exemplary embodiments of the present invention may be implemented in modified forms without departing from an essential feature of the present invention. In addition, a scope of the present invention should be interpreted according to claims and includes various modifications, alterations, and equivalences made by those skilled in the art.

What is claimed is:

1. A plug via stacked structure, comprising:
   a through hole plating layer that is plated on an inner wall of a through hole formed on a substrate at a predetermined thickness and around top and bottom of the through hole at a thickness t;
   a via plug that is filled in an inner space of the through hole plating layer and exposed by making top and bottom thereof penetrate through the top and bottom of the through hole plating layer;
   a circuit pattern that is formed over the top and bottom of the through hole plating layer and the via plug and makes a thickness t' formed on the through hole plating layer thicker than the thickness t; and
   a stacked conductive via that is filled in a via hole penetrating through a first insulating layer formed on the substrate and the circuit pattern and formed on the top of the through hole and is formed at thickness α from a top of the circuit pattern,
   wherein Equation T≤t"+α is satisfied,
   T represents a sum of the thickness t of the through hole plating layer and the thickness t' of the circuit pattern and t" is a thickness of a portion of the circuit pattern formed on the via plug.

2. The plug via stacked structure according to claim 1, wherein t'=t".

3. The plug via stacked structure according to claim 1, wherein t"=t'−Δt, and Δt is a height of the via plug protruded from a top surface of the through hole plating layer.

4. The plug via stacked structure according to claim 1, wherein when a diameter of the conductive via is D', a diameter of the via plug is d, and the smaller or same diameter of a diameter of the through hole plating layer of the top and bottom of the through hole and a diameter of the circuit pattern is D, D>D'>d.

5. The plug via stacked structure according to claim 4, wherein when a diameter of the through hole of the substrate is Dvia, D'>Dvia.

6. The plug via stacked structure according to claim 1, further comprising: a second insulating layer formed on the first insulating layer.

7. The plug via stacked structure according to claim 1, wherein the via plug is formed of an epoxy material or a conductive material.

8. A stacked substrate having a via stacked structure, comprising:
   a substrate on which a through hole is formed, a through hole plating layer plated on an inner wall of a through hole at a predetermined thickness and around top and bottom of the through hole at thickness t is formed, and a via plug filled in an inner space of the through hole plating layer and exposed by make top and bottom thereof penetrate through the top and bottom of the through hole plating layer is formed;
   a circuit pattern that is formed over the top and bottom of the through hole plating layer and the via plug and makes a thickness t' formed on the through hole plating layer thicker than a thickness t; and
   a first insulating layer formed on the substrate and the circuit pattern, and formed with a stacked conductive via that is filled in a via hole formed on the substrate and the circuit pattern and formed by penetrating through the top of the through hole to have a thickness α from a top of the circuit pattern,
   wherein Equation T≤t"+α is satisfied,
   T represents a sum of the thickness t of the through hole plating layer and the thickness t' of the circuit pattern and t" is a thickness of a portion of the circuit pattern formed on the via plug.

9. The stacked substrate according to claim 8, wherein t'=t".

10. The stacked substrate according to claim 9, wherein t"=t'−Δt, and Δt is a height of the via plug protruded from a top surface of the through hole plating layer.

11. The stacked substrate according to claim 8, further comprising:
   a second insulating layer formed on the first insulating layer.

12. The stacked substrate according to claim 8, wherein when a diameter of the conductive via is D', a diameter of the via plug is d, and the smaller or same diameter of a diameter of the through hole plating layer of the top and bottom of the through hole and a diameter of the circuit pattern is D, D>D'>d.

13. The stacked substrate according to claim 12, wherein when a diameter of the through hole of the substrate is Dvia, D'>Dvia.

14. The stacked substrate according to claim 8, wherein the via plug is formed of an epoxy material or a conductive material.

15. A method for manufacturing having a via stacked structure, comprising:
   forming a through hole plating layer on an inner wall of a through hole formed on a substrate at a predetermined thickness and around top and bottom of the through hole at thickness t and forming a via plug filled in an inner space of the through hole plating layer and exposed by penetrating through the top and bottom of the through hole plating layer;
   forming a circuit pattern formed over the top and bottom of the through hole plating layer and forming the ciruit pattern by making a thickness t' formed on the through hole plating layer thicker than a thickness t; and
   forming a stacked conductive via having a thickness α from the top of the circuit pattern by forming a first insulating layer on the substrate and the circuit pattern, forming a via hole penetrating through the first insulating layer on the top of the through hole, and filling the inside thereof,
   wherein in the forming of the stacked conductive via, Equation T≤t"+α is satisfied, T represents a sum of the thickness t of the through hole plating layer and the thickness t' of the circuit pattern and t" is the thickness of the portion of the circuit pattern formed on the via plug.

16. The method according to claim 15, wherein in the forming of the via plug, the exposed surface is flush with the surface of the through hole plating layer therearound, and t'=t".

17. The method according to claim 15, wherein in the forming of the via plug, the via plug is further protruded than the surface of the through hole plating layer therearound, $$t''=t'-\Delta t, \text{ and}$$

Δt is a height of the via plug protruded from a top surface of the through hole plating layer.

18. The method according to claim 15, further comprising: after the forming of the stacked conductive via, forming a second insulating layer on the first insulating layer.

19. The method according to claim 15, wherein when a diameter of the conductive via is D', a diameter of the via plug is d, and the smaller or same diameter of a diameter of the through hole plating layer of the top and bottom of the through hole and a diameter of the circuit pattern is D, D>D'>d.

20. The method according to claim 15, wherein in the forming of the via plug, the via plug is formed by filling the inner space of the through hole plating layer with an epoxy material or a conductive paste material.

* * * * *